United States Patent
Aihara

(10) Patent No.: US 9,184,076 B2
(45) Date of Patent: Nov. 10, 2015

(54) ELECTRONIC COMPONENT CONVEYING APPARATUS

(71) Applicant: SYNAX CO., LTD., Matsumoto-shi, Nagano-ken (JP)

(72) Inventor: Takamitsu Aihara, Koriyama (JP)

(73) Assignee: Synax Co., Ltd. (JP)

( * ) Notice: Subject to any disclaimer, the term of this patent is extended or adjusted under 35 U.S.C. 154(b) by 39 days.

(21) Appl. No.: 14/192,008

(22) Filed: Feb. 27, 2014

(65) Prior Publication Data

US 2014/0360846 A1  Dec. 11, 2014

(30) Foreign Application Priority Data

Jun. 7, 2013  (JP) .................................. 2013-120835

(51) Int. Cl.
*H01L 21/673* (2006.01)
*B65G 17/02* (2006.01)

(52) U.S. Cl.
CPC .......... *H01L 21/67333* (2013.01); *B65G 17/02* (2013.01); *H01L 2221/68309* (2013.01); *H01L 2221/68313* (2013.01)

(58) Field of Classification Search
CPC ............ B65G 17/002; H01L 21/67333; H01L 2221/68313; H01L 2221/68309
USPC .................. 198/465.1, 345.1, 345.3; 206/725
See application file for complete search history.

(56) References Cited

U.S. PATENT DOCUMENTS

| | | | | |
|---|---|---|---|---|
| 4,868,974 A | * | 9/1989 | Nishiguchi | ....................... 29/740 |
| 5,348,142 A | * | 9/1994 | Nishimura et al. | ....... 198/867.08 |
| 5,418,692 A | * | 5/1995 | Nemoto | ........................ 361/809 |
| 5,438,740 A | * | 8/1995 | Carr et al. | ....................... 29/33 P |
| 5,957,293 A | * | 9/1999 | Pakeriasamy | .................. 206/725 |
| 6,036,023 A | * | 3/2000 | Pfahnl et al. | ................... 206/725 |
| 6,079,565 A | * | 6/2000 | Walsh et al. | ................... 206/725 |
| 8,970,244 B2 | * | 3/2015 | Di Stefano et al. | ...... 324/757.01 |
| 2002/0162770 A1 | | 11/2002 | Chang | |

(Continued)

FOREIGN PATENT DOCUMENTS

| JP | H10284878 | 10/1998 |
|---|---|---|
| JP | 2004-186373 A | 7/2004 |

(Continued)

OTHER PUBLICATIONS

Search Report and Examination Report mailed Nov. 27, 2014 for Singapore Application No. 10201400285U.
Office Action mailed on Jul. 21, 2015 in a corresponding application filed in Taiwan (with English translation) (11 pages).

*Primary Examiner* — Mark A Deuble
(74) *Attorney, Agent, or Firm* — Harness, Dickey & Pierce, P.L.C.

(57) ABSTRACT

A first and second guide block pieces retain a plurality of electronic components in an electronic component retention space formed and fixed on a shuttle plate by using a position determination hole formed in advance in accordance with a distance between a pair of opposing corners of a bottom surface of an electronic component, and by emitting light ranging from one end portion to the other end portion of the shuttle plate along an upper surface of a plurality of electronic components interposed and retained between the electronic component interposing-and-retaining portions along longitudinal directions of the first and second guide block pieces, an optical sensor detects that the emitted light is blocked by an irregularly inclined electronic component.

4 Claims, 5 Drawing Sheets

(56) References Cited

U.S. PATENT DOCUMENTS

| | | | |
|---|---|---|---|
| 2008/0173569 A1* | 7/2008 | Forsyth | 206/725 |
| 2011/0042265 A1 | 2/2011 | Hofmann et al. | |
| 2011/0226587 A1 | 9/2011 | Koizumi | |
| 2013/0078768 A1* | 3/2013 | Hsu et al. | 438/113 |

FOREIGN PATENT DOCUMENTS

| | | |
|---|---|---|
| JP | 2007-208088 A | 8/2007 |
| JP | 5021780 | 6/2012 |
| TW | 200820371 A | 5/2008 |
| WO | WO-99/03130 A1 | 1/1999 |

\* cited by examiner

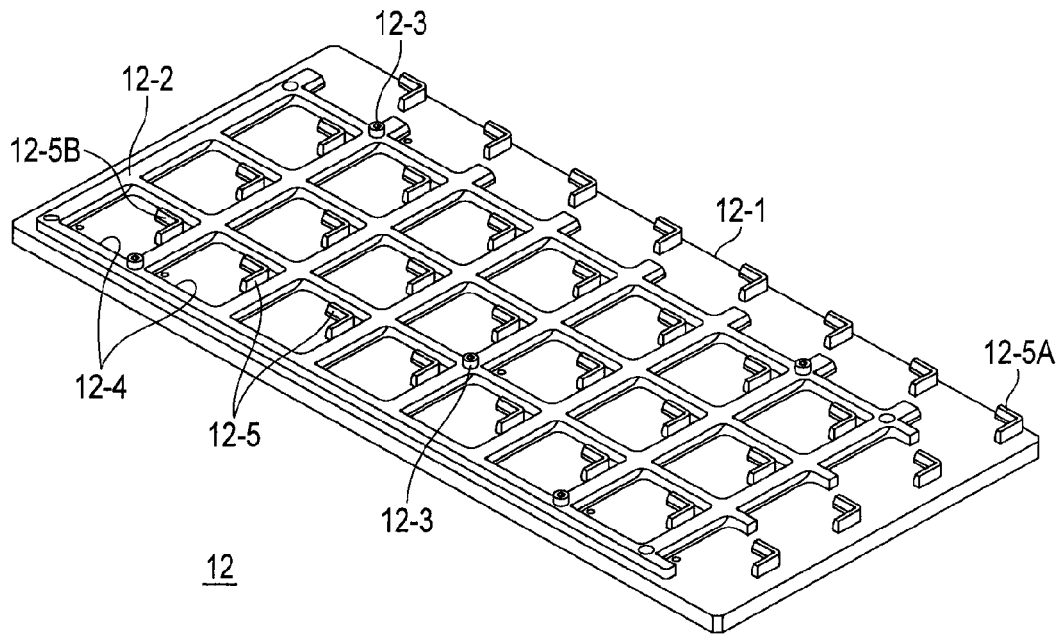
F I G. 2
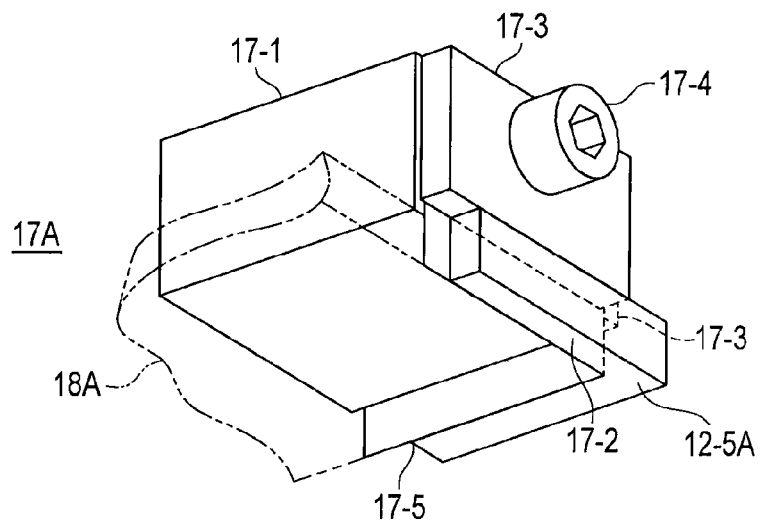
F I G. 3

ELECTRONIC COMPONENT CONVEYING APPARATUS

CROSS-REFERENCE TO RELATED APPLICATIONS

This application is based upon and claims the benefit of priority from prior Japanese Patent Application No. 2013-120835, filed Jun. 7, 2013, the entire contents of which are incorporated herein by reference.

FIELD

Embodiments described herein relate generally to an apparatus for dealing with electronic components. In particular, the embodiments relate to an electronic component conveying apparatus used for conveying a plurality of electronic components such as IC devices from a process unit to the next process unit when the electrical characteristics of the electronic components are measured, before the manufactured components are shipped.

BACKGROUND

Generally, the performance of newly manufactured electronic components such as IC devices is tested before the components are shipped. For example, the electrical characteristics of the components are measured. To do this, an IC handler takes out IC devices to be tested in series from an accumulation position of the manufactured IC devices and sends a plurality of IC devices of each lot to a measuring unit. This IC handler includes an apparatus for conveying IC devices.

A conventional apparatus for conveying IC devices includes a shuttle table. At the time of conveyance, in order to precisely convey an IC device or a plurality of IC devices placed on the shuttle table to a measuring position within a measuring unit, each IC device must be accurately retained at the predetermined position on the shuttle table. For this purpose, a device for retaining IC devices is used.

For example, a recessed pocket formed to match the outer shape of an IC device, or a recessed pocket formed to match the outer shape of a guide component holding an IC device is formed on the surface of the shuttle table. As a conventional device for retaining IC devices, an IC device retaining tool which is inserted into the recessed pocket so as to be fixed and comprising an IC device receiving portion is used.

The outer shape of each IC device to be tested is a rectangular parallelepiped. The rectangular parallelepiped has a top surface, a bottom surface and side surfaces, and each surface has a quadrilateral shape such as a square or a rectangle. However, there are a wide variety of types for IC devices. The length, width and thickness of a rectangular parallelepiped vary depending on the lot of the IC device. Therefore, a conventional shuttle table needs to be structured as follows. A recessed pocket having dimensions which can receive an IC device retaining tool comprising a reception portion formed to match the dimensions of the outer shape including the thickness of the IC device to be tested has to be individually formed. Further, a plurality of IC device retaining tools having different dimensions must be prepared in advance as a so-called change kit for each IC device. However, costs for preparing change kits are very high. In addition, it is very troublesome to exchange change kits in accordance with the types of the IC devices.

Conventional techniques have led to the development of an IC device conveying apparatus configured to interpose and fix an IC device or a plurality of IC devices between a pair of slide guide plates configured to independently move away from and toward each other on a conveyance shuttle, instead of preparing a plurality of change kits in advance for each IC device having a different outer shape dimension. (For example, refer to patent literature 1.)

Patent Literature 1: Japanese Patent No. 5021780

The IC device conveying apparatus described in patent literature 1 is configured to interpose and fix an IC device or a plurality of IC devices between the pair of slide guide plates explained above. Therefore, if a tightening screw of the slide guide plates becomes loose because of shaking during conveyance, the slide guide plates may be moved, and the IC device may be moved or deviate from a fixed position. Thus, a problem may be caused in conveyance. Moreover, when an IC device or a plurality of IC devices are interposed and fixed between the above pair of slide guide plates, the IC device is sometimes fixed at an angle relative to the surface of a shuttle plate between a pair of slide guide plates. In this case, the inclined IC device is conveyed to the next measuring unit, and the IC device may be set at an angle in the measuring unit. In this case, it is easily presumed that a normal measurement result cannot be obtained.

In the method of preparing a plurality of change kits in advance for each IC device having a different outer shape dimension as a conventional IC device conveying apparatus, costs for preparing a variety of change kits are very high, and it is very troublesome to exchange change kits. In the method of interposing and fixing an IC device between a pair of slide guide plates, if the IC device is fixed at an angle relative to the surface of a shuttle plate and is set at an angle in the next measuring unit, a normal measurement result may not be obtained. This problem occurs with the other electronic components as well as IC devices.

In order to solve the above problem, an embodiment of the present invention provides an electronic component conveying apparatus configured to be commonly used for electronic components such as IC devices having different outer shape dimensions without using change kits and ensure retention in a normal posture on a shuttle plate. Thus, the apparatus is configured to easily and accurately convey electronic components to the next unit including a measuring unit and always obtain an accurate measurement result at low cost.

An embodiment of the present invention provides an electronic component conveying apparatus, comprising:

a conveyance plate which conveys a plurality of electronic components having a rectangular bottom surface and a rectangular parallelepiped shape, the plurality of electronic components being placed on the conveyance plate;

a plurality of electronic component interposing-and-retaining units which have an inner shape corresponding to two side surfaces interposing one opposing corner of a pair of opposing corners of the bottom surface of each of the plurality of electronic components placed on the conveyance plate, and are fixed on the conveyance plate; and a lattice plate which comprises a plurality of lattices having an inner dimension larger than a bottom surface dimension of the plurality of electronic components, has a shape in which, when the lattice plate is placed on the conveyance plate, two side surfaces interposing one opposing corner of a pair of opposing corners of each of the lattices are positioned in proximity so as to be away from an outer side surface of the electronic component interposing-and-retaining units fixed on the conveyance plate by a predetermined gap or distance and two side surfaces interposing the other opposing corner of the lattice correspond to two side surfaces interposing the other opposing corner of the electronic component, and is fixed on the conveyance plate, wherein a plurality of flexible electronic component retention spaces are formed in accordance with an outer shape dimension of an electronic component to be conveyed between the electronic component interposing-and-retaining units fixed on the conveyance plate in proximity to the two side surfaces interposing one opposing corner of the lattice of the lattice plate and the two side surfaces interposing the other opposing corner of the lattice.

Further, the embodiment of the electronic component conveying apparatus uses, when a plurality of electronic components are retained in the electronic component retention spaces, a gap or distance adjustment jig forming the predetermined gap between each of the electronic components and each of the electronic component interposing-and-retaining units.

Another embodiment of the present invention provides an electronic component conveying apparatus, comprising:

a shuttle plate which has a plurality of position determination holes and is configured to convey a plurality of electronic components having a rectangular bottom surface and a rectangular parallelepiped shape, the plurality of electronic components being placed on a surface of the shuttle plate;

at least a first guide block which is fixed on the shuttle plate by a position determination bolt screwed at a predetermined position of the plurality of position determination holes, wherein a first plurality of electronic component interposing-and-retaining portions having a shape corresponding to two side surfaces interposing one opposing corner of a pair of opposing corners of a bottom surface of the electronic components are formed along a longitudinal direction of the first guide block;

at least a second guide block which is fixed on the shuttle plate by another position determination bolt screwed at another predetermined position of the plurality of position determination holes, facing the first guide block, wherein a second plurality of electronic component interposing-and-retaining portions having a shape corresponding to two side surfaces interposing the other opposing corner of the pair of opposing corners of the bottom surface of the electronic components are formed along a longitudinal direction of the second guide block;

a transmission type of optical sensor provided on the shuttle plate, the optical sensor including a light emission unit which emits light having an optical axis ranging from one end portion to the other end portion of the shuttle plate along an upper surface of a plurality of electronic components interposed and retained between the first and second electronic component interposing-and-retaining portions along the longitudinal directions of the first and second guide blocks, and further including an optical sensor which detects the light at the other end portion of the shuttle plate;

a sensor slit plate which sets the emitted light so as to pass through a position kept away by a predetermined distance from an upper surface of each of the plurality of electronic components interposed and retained between the first and second electronic component interposing-and-retaining portions in accordance with a thickness of the electronic components between the end portions of the shuttle plate; and a height position adjustment device which adjusts a height position of an upper end of the sensor slit plate, wherein the first and second guide blocks retain a plurality of electronic components in an electronic component retention space formed and fixed on the shuttle plate fixed at a position determination hole determined in advance in accordance with a distance between the pair of opposing corners of the bottom surface of an electronic component to be conveyed.

According to the embodiments, it is possible to provide an electronic component conveying apparatus which can retain an electronic component such as an IC device regardless of the outer shape dimension of the electronic component without changing a retention component such as a change kit, reduce the handling cost for manufacturing and shipping the electronic component, and easily and accurately convey the electronic component to the next processing unit such as electric characteristics measuring unit.

BRIEF DESCRIPTION OF THE DRAWINGS

FIG. 2 is a perspective illustration showing a structure of a preheat plate for preheating electronic components in a first embodiment.

FIG. 3 is a perspective illustration showing a structure of a gap adjustment block for determining a position of a lattice plate when the electronic component in the first embodiment is placed on the preheat plate.

DETAILED DESCRIPTION

Various embodiments will be described hereinafter with reference to the accompanying drawings.

The embodiments provide an electronic component conveying apparatus which is a so-called universal change kit. The universal change kit is an electronic component position determining jig which can be widely used and deal with various kinds of electronic components when electronic components are conveyed in an electronic component handling apparatus, for example, an IC handler, used for measuring and classifying electrical characteristics of electronic components such as IC devices.

Hereinafter, the embodiments are explained, looking at, as an example, an IC device conveying apparatus used for a so-called IC handler which is a handler for IC devices for handing electronic components at the manufacturing and shipping stages.

Figure 1:
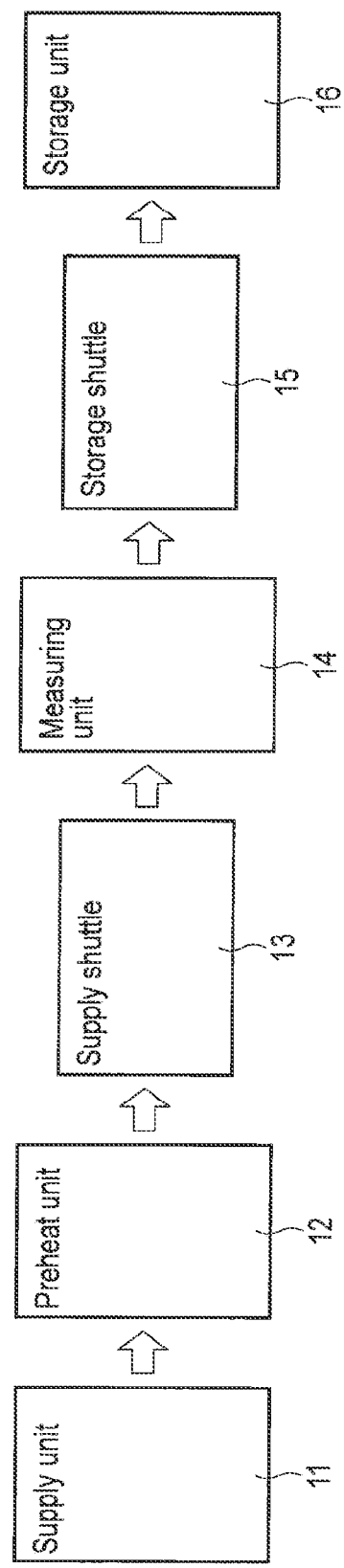
FIG. 1 shows a flow of an electronic component handling in an IC handler according to embodiments of the present invention.

FIG. 1 shows the flow of an electronic component handling in the IC handler related to the embodiments of the present invention. In FIG. 1, IC devices whose electrical characteristics should be measured for classification are accumulated in a supply unit 11 by each lot. Each of the IC devices in a lot has the same sized rectangular parallelepiped outer shape including a rectangular bottom surface. The electrical characteristics of the IC devices need to be measured under predetermined temperature conditions. Therefore, the IC devices are conveyed from the supply unit 11 to a preheat unit 12, and preheated so as to be at the predetermined temperature. After that, the IC devices are placed on a supply shuttle 13 which is a conveying apparatus, and conveyed to a measuring unit 14. The predetermined temperature generally ranges from −50° C. to +150° C. After various electrical characteristics have been measured at the predetermined temperature in the measuring unit 14, the IC devices are placed on a storage shuttle 15 which is another conveying apparatus, and conveyed to a storage unit 16. Thus, in this invention, the IC device conveying apparatus is embodied as the preheat unit 12, the supply shuttle 13 and the storage shuttle 15 in FIG. 1.

An embodiment of the present invention is an IC device conveying apparatus used for the preheat unit 12. As shown in FIG. 2, the IC device conveying apparatus comprises a flat preheat plate 12-1, a lattice-shaped guide plate 12-2 placed on the preheat plate 12-1, a plurality of fixing bolts 12-3 for fixing the guide plate 12-2 on the preheat plate 12-1, a plurality of rectangular lattices 12-4 formed on the guide plate 12-2, and a plurality of L-shaped IC device retention members 12-5, 12-5A and 12-5B fixed at regular intervals on the longitudinal and horizontal axes on the preheat plate 12-1 within the lattices 12-4.

IC devices to be preheated are placed on the preheat plate 12-1 with the IC devices inserted into the lattices 12-4 respectively formed in the guide plate 12-2. When the IC devices are preheated, each of them is interposed and retained in the retention space formed between two inner side surfaces of each IC device retention member 12-5 and two side surfaces interposing a corner of the lattice 12-4, the corner being opposite to a close corner of the lattice 12-4 to the member 12-5. Although the IC devices retained in this structure shown in FIG. 2, the IC devises retained in the structure are shown in to FIG. 4 and FIG. 5.

Hereinafter, a method for accurately determining the position of IC devices and retaining the IC devices at the predetermined positions within the lattices 12-4 formed on the guide plate 12-2 will be described in detail with reference to FIG. 3 to FIG. 5.

FIG. 3 is a perspective illustration showing a structure of a gap adjustment block 17 used for leaving or setting a predetermined gap between an IC device and the retention member 12-5 in order to absorb an manufacturing error caused in the dimension fluctuation of the outer shape of the IC device when the IC device is inserted into the aforementioned retention space within the lattice 12-4. In FIG. 3, a shim plate 17-2 formed of an L-shaped thin plate is attached along two adjacent side surfaces of a block main body 17-1 which is a rectangular parallelepiped. Two outer side surfaces of the shim plate 17-2 are pressed by a pair of pressing plates 17-3. Each of the two outer side surfaces of the shim plate 17-2 is fixed by a fixing screw 17-4 via the pressing plates 17-3. At this time, the shim plate 17-2 is fixed in such a way that a predetermined length of the bottom end 17-5 of the shim plate 17-2 protrudes from the bottom surface of the block main body 17-1. The predetermined length is set to a dimension corresponding to the thickness of the IC device to be preheated. The thickness of the shim plate 17-2 corresponds to the predetermined gap between the IC device and the retention member 12-5 when the Ic device is retained in the retaining space formed in the lattice 12-4 of the guide plate 12-2. Because of this gap, even if an IC device has a manufacturing error, it is possible to avoid such a situation that the IC device is stuck in the lattice 12-4 and cannot be pulled out of it.

Hereinafter, with reference to FIG. 4 and FIG. 5, a method for placing each IC device at the predetermined position on the preheat plate 12-1 is explained.

Figure 4:
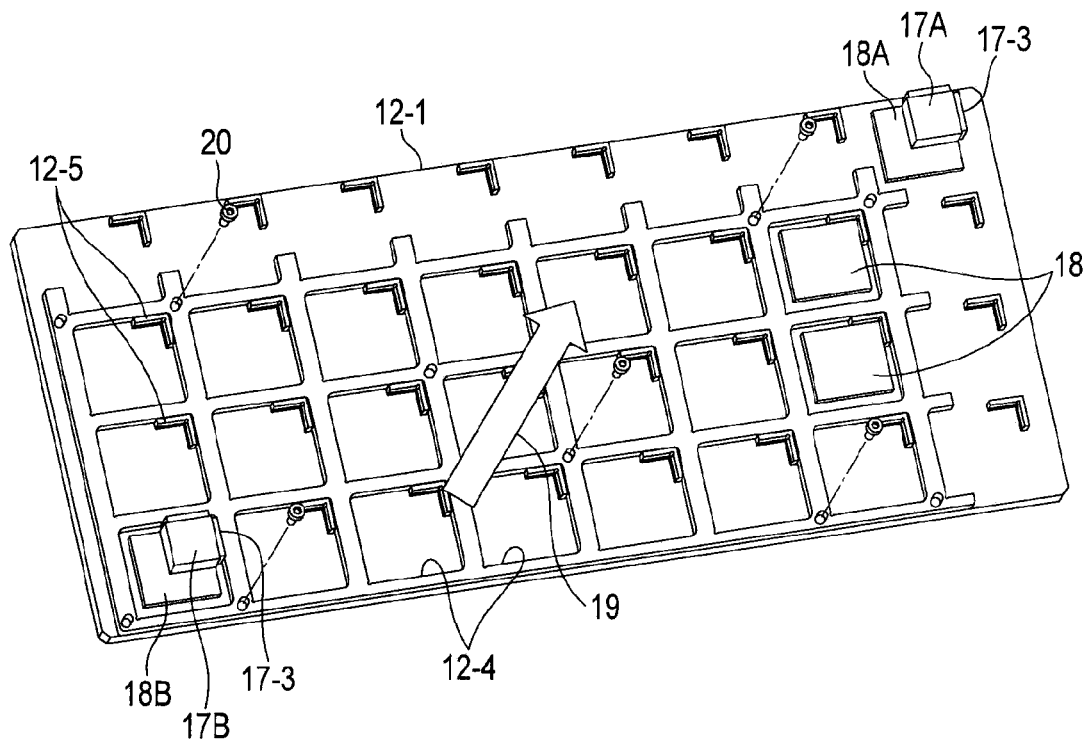
FIG. 4 is a perspective illustration showing a state before the position of the lattice plate is adjusted and fixed when the electronic component in the first embodiment is placed on the preheat plate.
Figure 5:
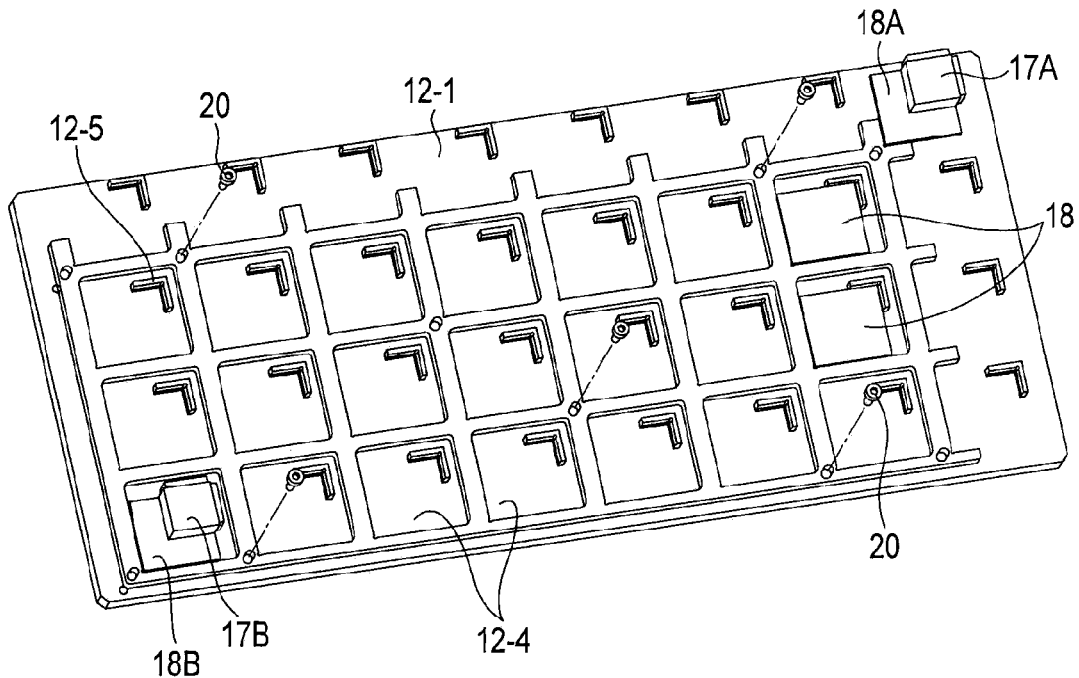
FIG. 5 is a perspective illustration showing a state after the position of the lattice plate is adjusted and fixed when the electronic component in the first embodiment is placed on the preheat plate.

In FIG. 4, before all IC devices 18 (only two devices 18 are shown as a reference) to be preheated are placed on the preheat plate 12-1, the guide plate 12-2 is moved in the direction opposite to the direction shown by an arrow 19 in advance so that the guide plate 12-2 is placed at an original position. At the original position, the two side surfaces interposing an inner corner of each lattice 12-4 make contact with the outer surfaces of each retention member 12-5. In this state, gap adjustment blocks 17A and 17B are placed in such a way that the shim plate 17-2 shown in FIG. 3 makes contact with the inner surfaces of a retention member 12-5A fixed in the vicinity of one opposing corner of the preheat plate 12-1 shown in FIG. 2 and a retention member 12-5B fixed in the vicinity of the other opposing corner. The IC devices 18A and 18B are pressed in such a way that two side surfaces interposing an opposing corner of each bottom surface make contact with the inner side surfaces of the shim plate 17-2. The IC devices 18A and 18B are two of IC devices of one lot taken from the supply unit 11 of FIG. 1. The two IC devices 18A and 18B are used as jigs when the gap between the IC device 18 and the retention member 12-5 is set. In this state, all IC devices to be preheated are taken out from the supply unit 11 and inserted into all lattices 12-4 within the guide plate 12-2 although this is not shown in FIG. 4 or FIG. 5. In an example of FIG. 4 and FIG. 5, the number of lattices 12-4 which are completely closed on the guide plate 12-2 is twenty one. In addition to the twenty one lattices 12-4, there are another eleven inner corner units formed into a lattice which is partially discontinuous. The eleven inner corner units are configured to hold IC devices in cooperation with the retention members 12-5. All of the thirty two lattices are configured to retain IC devices. However, the IC devices 18A and 18B are already placed in two of the lattices as gap adjustment jigs. Therefore, the number of IC devices 18 which are actually preheated is thirty. As explained later, the eleven lattices which are partially discontinuous are discontinuous in such a way that the guide plate 12-2 does not protrude to the outside of the end portion of the preheat plate 12-1 when the guide plate 12-2 is moved in the direction of the arrow 19 shown in FIG. 4.

As explained in FIG. 4, after the IC devices 18 are placed in predetermined or all of the lattices 12-4 of the guide plate 12-2, the guide plate 12-2 is moved in the direction of the arrow 19 of FIG. 4 from the original position. In other words, the guide plate 12-2 is moved in the direction of and stopped at each retention member 12-5 fixed on the preheat plate 12-1. This state is shown in FIG. 5. As a result, two side surfaces interposing one of two opposing corners of the bottom surface of the IC device 18 make contact with the L-shaped inner side surface of the retention member 12-5. Two side surfaces interposing the other opposing corner of the bottom surface of the IC device 18 make contact with two inner side surfaces interposing the corresponding opposing corner of the lattice 12-4. In this manner, a retention space for retaining the electronic component 18 by two side surfaces interposing each corner of a pair of opposing corners of the bottom surface of the IC device 18 is formed between the retention member 12-5 and the lattice 12-4. In this state, the guide plate 12-2 is fixed on the preheat plate 12-1 by a plurality of bolts 20.

In this embodiment, in FIG. 4, the distance of the move of the guide plate 12-2 in the direction of the arrow 19 can be freely adjusted depending on the dimension of the outer shape of the IC device 18. The direction of the arrow 19 is the direction of each retention member 12-5 fixed on the preheat plate 12-1. Therefore, without exchanging a retention component such as a change kit, it is possible to hold a plurality of IC devices 18 by each lot unit even if the dimension of the outer shape of the IC devices changes lot by lot. Thus, it is possible to decrease the handling cost at the manufacturing and shipping stages, and easily and accurately convey the IC devices 18 to the next measuring process for handling.

The IC devices 18 preheated at the preheat unit 12 are conveyed to the next measuring unit 14. For this conveyance, a conveying apparatus is used. The conveying apparatus is the supply shuttle 13 as shown in FIG. 1. The IC devices 18 which are preheated so as to have the predetermined temperature on the preheat plate 12-1 are transferred from the preheat plate 12-1 to the supply shuttle 13 by using a robot arm of the IC handler, etc., which is not shown in the drawings. For the IC handler, an IC handler which is normally used in this field can be employed. Therefore, detailed explanation of operations or functions for the IC handler is omitted here.

Figure 6:
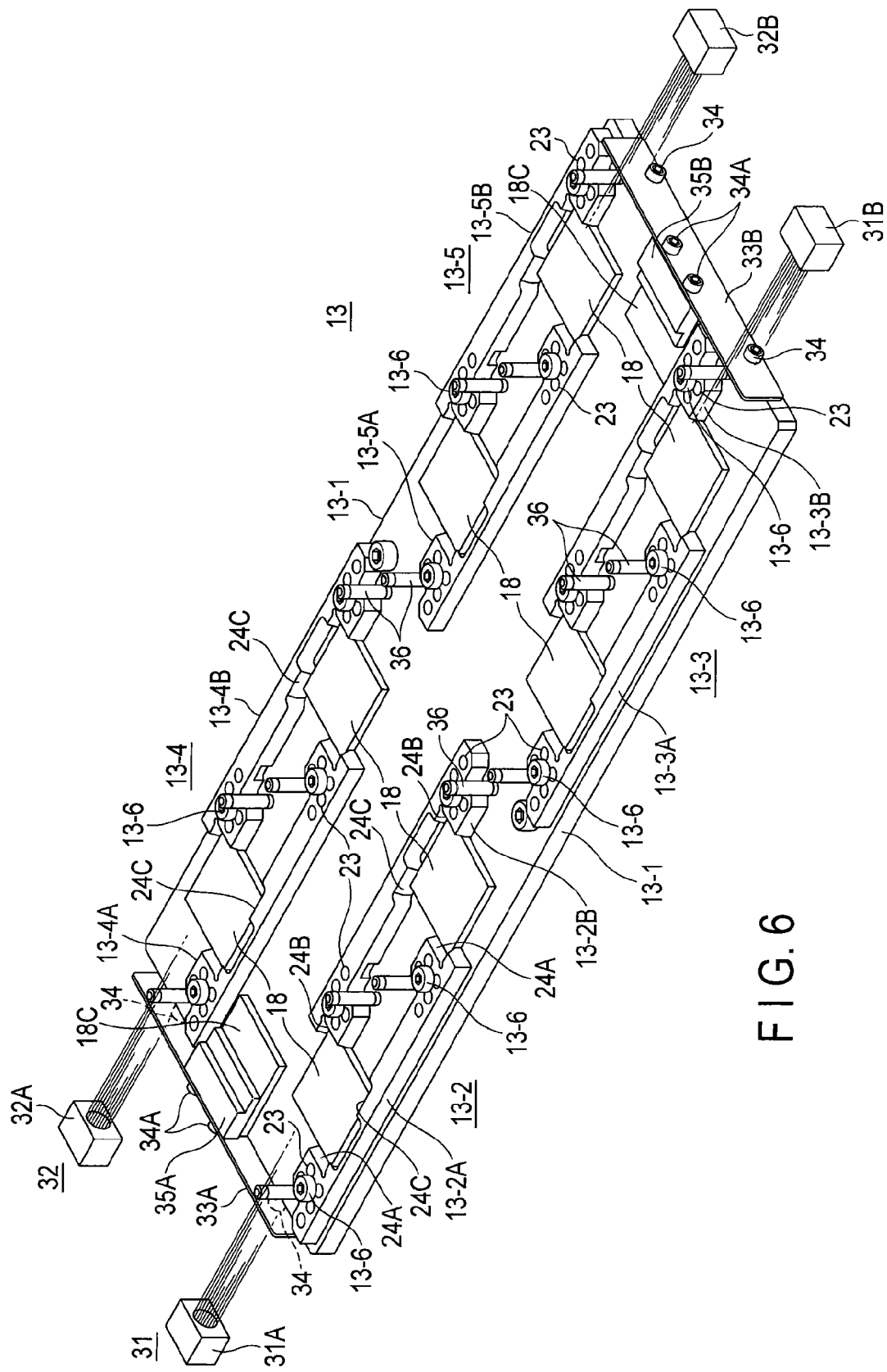
FIG. 6 is a perspective illustration showing a conveyance plate on which electronic components in a second embodiment are placed.
Figure 7:
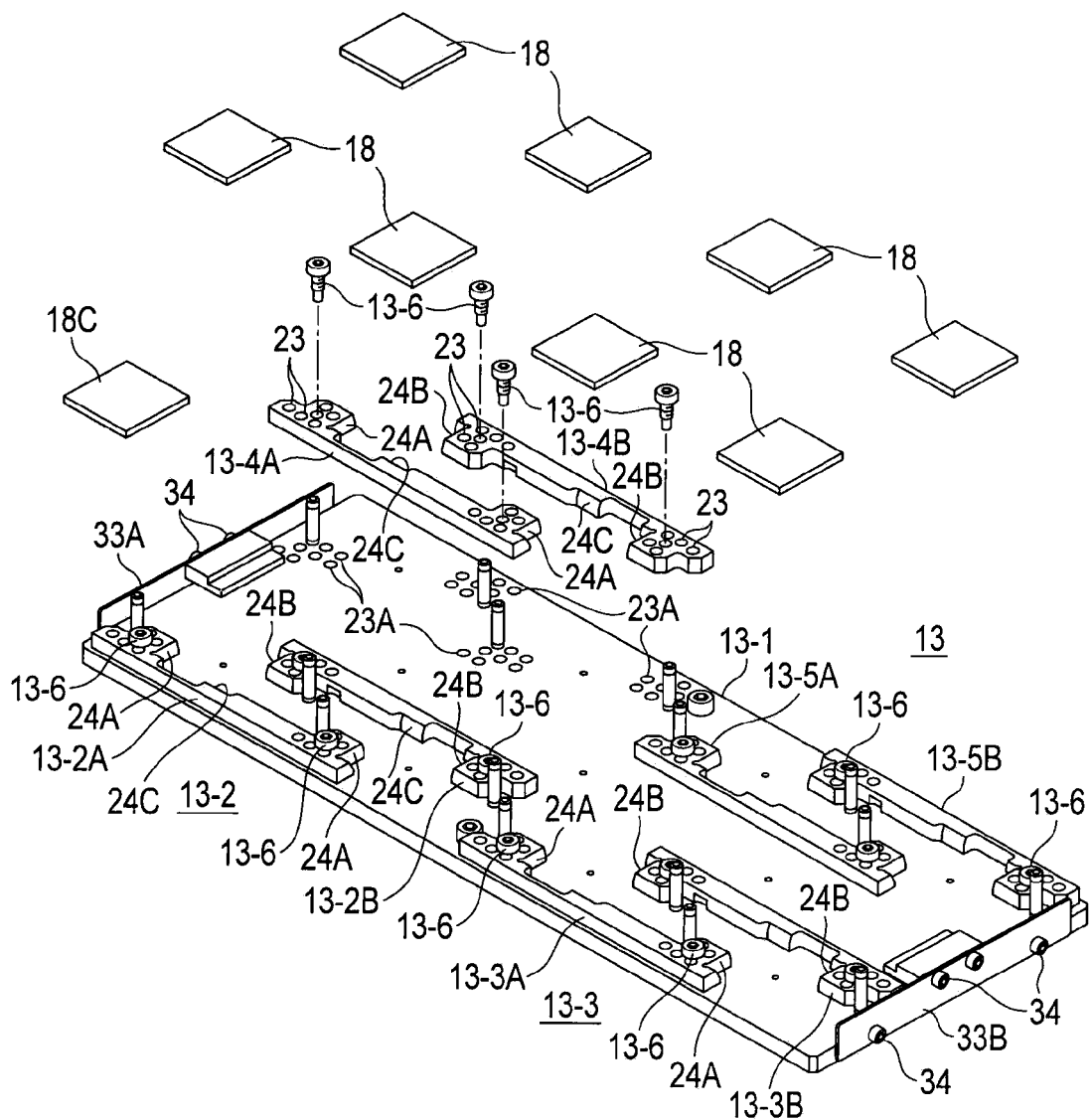
FIG. 7 is an exploded perspective illustration showing the conveyance plate on which the electronic components in the second embodiment in FIG. 6 are placed.

FIG. 6 and FIG. 7 illustrate an embodiment of the supply shuttle 13. FIG. 6 is a perspective illustration, and FIG. 7 is a perspective illustration shown by disassembling main parts of the structure of FIG. 6. In FIG. 6 and FIG. 7, the supply shuttle 13 is structured by using a flat shuttle plate 13-1. On the shuttle plate 13-1, four pairs of guide blocks 13-2, 13-3, 13-4 and 13-5 are attached. The guide block 13-2 is structured by a pair of guide block pieces 13-2A and 13-2B. Similarly, the guide blocks 13-3, 13-4 and 13-5 are structured by a pair of guide block pieces 13-3A, 13-3B, 13-4A, 13-4B, 13-5A and 13-5B respectively. The guide blocks 13-2 and 13-3 are arranged in line along a longer side surface of the shuttle plate 13-1. The guide blocks 13-4 and 13-5 are arranged in line along the other side surface of the shuttle plate 13-1.

On the top surface of the shuttle plate 13-1, a plurality of screw holes 23A shown in detail in FIG. 7 are formed. The guide block pieces 13-2A, 13-2B, 13-3A, 13-3B, 13-4A, 13-4B, 13-5A and 13-5B are fixed to the screw holes 23A by position determination bolts 13-6 through position determination holes 23 formed in the guide block pieces. Two IC devices 18 are retained in each guide block 13-2, 13-3, 13-4 and 13-5.

In the guide block piece 13-2A which is one of two guide block pieces of the guide block 13-2, two IC device interposing-and-retaining portions 24A are formed along the longitudinal direction of the guide block piece 13-2A. The shape of the IC device interposing-and-retaining portion 24A corresponds to two side surfaces interposing one opposing corner of a pair of opposing corners of the bottom surface of the IC device 18. In the guide block piece 13-2B which is the other guide block piece of the guide block 13-2, two IC device interposing-and-retaining portions 24B are formed along the longitudinal direction of the guide block piece 13-2B. The shape of the IC device interposing-and-retaining portion 24B corresponds to two side surfaces interposing the other opposing corner of the pair of opposing corners of the bottom surface of the IC device 18. Similarly, in each of the guide block pieces 13-3A, 13-3B, 13-4A, 13-4B, 13-5A and 13-5B of the remaining guide blocks 13-3, 13-4 and 13-5, two IC device interposing-and-retaining portions 24A and two IC device interposing-and-retaining portions 24B are formed along the longitudinal direction of each guide block piece.

In this manner, the retaining portions 24A and 24B are formed in the guide block pieces 13-2A and 13-2B of the guide block 13-2. Between the retaining portions 24A and 24B, two side surfaces interposing each of a pair of opposing corners of the bottom surface of the IC device 18 to be conveyed are interposed and retained. Similarly, the IC device 18 is held in each of the other guide blocks 13-3 to 13-5. If the dimension of the outer shape of the IC device 18 differs because the lot of the IC device 18 differs, it is possible to deal with the IC device 18 by fixing the guide blocks 13-2 to 13-5 to other screw holes 23A formed for each lot in advance on the top surface of the shuttle plate 13-1 by using the position determination bolts 13-6.

In the embodiment shown in FIG. 6 and FIG. 7, in the vicinity of the shuttle plate 13-1, an optical sensor 31 of a transmission type is provided in common along the longitudinal direction of the first and second guide blocks 13-2 and 13-3 provided along one of the longer sides of the shuttle plate 13-1. The optical sensor 31 is structured by a light emission unit 31A which emits light having an optical axis ranging from one end to the other end of the shuttle plate 13-1 along the top surfaces of the four IC devices 18 interposed and held, and an optical sensor 31B which detects the light emitted from the light emission unit 31A at the other end of the shuttle plate 13-1.

Similarly, an optical sensor 32 of a transmission type is provided in common along the longitudinal direction of the third and fourth guide blocks 13-4 and 13-5 provided along the other longer side of the shuttle plate 13-1. The optical sensor 32 is structured by a light emission unit 32A which emits light having an optical axis ranging from one end to the other end of the shuttle plate 13-1 along the top surfaces of the four IC devices 18 interposed and held, and an optical sensor 32B which detects the light emitted from the light emission unit 32A at the other end of the shuttle plate 13-1.

A sensor slit plate 33A is fixed to a short side surface of the shuttle plate 13-1 by a fixing bolt 34, the short side surface facing the light emission units 31A and 32A. A sensor slit plate 33B is fixed to another short side surface of the plate 13-1 which faces the optical sensors 31B and 32B by the fixing bolt 34. Holes through which the fixing bolts 34 formed on the sensor slit plates 33A and 33B penetrate are formed in the short side surface of the shuttle plate 13-1. By this structure, the upper ends of the sensor slit plates 33A and 33B are formed so as to adjust the height position protruding from the top surface of the shuttle plate 13-1 to the above. The height position is the protrusion length.

The height is adjusted by using height adjustment blocks 35A and 15B fixed to the sensor slit plates 33A and 33B by the fixing bolts 34A for adjusting the height of the sensor slit plates 33A and 33B in line with the actual thickness of the IC device 18C which is used as a height adjusting jig and having the same outer shape as the devices being conveyed. When the height is adjusted, the IC device 18C is placed immediately beneath the height adjustment blocks 35A and 35B. In this state, the fixing bolt 34 is loosened, and the sensor slit plates 33A and 33B are moved up and down in such a way that the height of the upper end of the sensor slit plates 33A and 33B is the same as upper surface height of the height adjustment blocks. At that position, the fixing bolt 34 is tightened.

As a result, in accordance with the thickness of the IC device 18 placed on the shuttle plate 13-1, the light emitted from the light emission units 31A and 32A can pass through the position kept away from the upper surface of the IC device 18 interposed and retained between the interposing-and-retaining portions 24A and 24B formed in the guide blocks 13-2 to 13-5 by only the predetermined distance. By this structure, both of the optical sensors 31B and 32B can obtain reception light output when the IC device 18 interposed and held between the interposing-and-retaining portions 24A and 24B formed in the guide blocks 13-2 to 13-5 is normal.

On the other hand, when the IC device 18 is interposed and retained at a tilted state, the IC device 18 is held while a part of the IC device 18 protrudes from a planar surface including the upper end of the sensor slit plates 33A and 33B. For example, when at least one of the four IC devices 18 interposed and retained between the interposing-and-retaining portions 24A and 24B formed in the guide blocks 13-2 and 13-3 is interposed and held with an inclination state, the light emitted from the light emission unit 31A is blocked by the protruded portion of the IC device 18 which is interposed and held at the tilted state. Thus, light is not received in the optical sensor 31B which is a light reception unit. In this manner, it is possible to detect that there is an IC device 18 interposed and held with an inclination, and eliminate the inclination of the IC device 18 before it is conveyed to the measuring unit 14.

In FIG. 6 and FIG. 7, a plurality of guide pins 36 are attached on the shuttle plate 13-1, and they protrude high from the surface of the shuttle plate 13-1. The plurality of guide pins 36 are used for conducting position determination when the supply shuttle 13 on which the IC device 18 is placed is conveyed to the measuring unit 14 and a robot arm which is provided in the measuring unit 14 and is not shown in the drawings absorbs the conveyed IC device using a suction unit. Since the guide pins 36 are not directly related to the embodiments of the present invention, detailed explanations of the functions for the guide pins 36 are omitted.

In FIG. 1, after electric characteristics of the IC devices 18 are measured in the predetermined temperature conditions in the measuring unit 14, the IC devices 18 are placed on the storage shuttle 15 and conveyed to the next storage unit 16. The storage shuttle 15 used at this time may have the same structure as the supply shuttle 13. Therefore, detailed explanations for the storage shuttle 15 are omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. Even when a structural element is separately expressed in claims, or a plurality of elements are combined in claims, or a separated element and combined elements are combined in claims, they are all within the scope of the present invention. Further, even when claim is directed to a method, a step, or a program, the apparatus of the present invention is applied to the claim. The accompanying claims and their equivalents are intended to cover such forms or modifications as would fall within the scope and spirit of the inventions.

What is claimed is:

1. An electronic component conveying apparatus, comprising:
    a conveyance plate which conveys a plurality of electronic components having a rectangular bottom surface and a rectangular parallelepiped shape, the plurality of electronic components being placed on the conveyance plate;
    a plurality of electronic component interposing-and-retaining portions which have an inner shape corresponding to two side surfaces interposing one opposing corner of a pair of opposing corners of the bottom surface of each of the plurality of electronic components placed on the conveyance plate, and are fixed on the conveyance plate; and
    a lattice plate which comprises a plurality of lattices having an inner dimension larger than a bottom surface dimension of the plurality of electronic components, has a shape in which, when the lattice plate is placed on the conveyance plate, two side surfaces interposing one opposing corner of a pair of opposing corners of each of the lattices are positioned in proximity so as to be away from an outer side surface of the electronic component interposing-and-retaining portions fixed on the conveyance plate by a predetermined distance and two side surfaces interposing the other opposing corner of the lattice correspond to two side surfaces interposing the other opposing corner of the electronic component, and is fixed on the conveyance plate, wherein
    a plurality of electronic component retention spaces are formed in accordance with an outer shape dimension of an electronic component to be conveyed between the electronic component interposing-and-retaining portions fixed on the conveyance plate in proximity to the two side surfaces interposing one opposing corner of the lattice of the lattice plate and the two side surfaces interposing the other opposing corner of the lattice.

2. The electronic component conveying apparatus of claim 1, wherein, when a plurality of electronic components are retained in the electronic component retention spaces, a gap adjustment jig is provided between each of the electronic components and each of the electronic component interposing-and-retaining portions, and wherein,
    a predetermined gap is formed between each of the electronic components and each of the electronic component interposing-and-retaining portions by the gap adjustment jig.

3. An electronic component conveying apparatus, comprising:
    a shuttle plate which has a plurality of position determination holes and conveys a plurality of electronic components having a rectangular bottom surface and a rectangular parallelepiped shape, the plurality of electronic components being placed on the shuttle plate;
    a first guide block which is fixed on the shuttle plate by a position determination member fixed at a predetermined position of the plurality of position determination holes, wherein a first plurality of electronic component interposing-and-retaining portions having a shape corresponding to two side surfaces interposing one opposing corner of a pair of opposing corners of a bottom surface of the electronic components are formed along a longitudinal direction of the first guide block;
    a second guide block which is fixed on the shuttle plate by another position determination member fixed at another predetermined position of the plurality of position determination holes, facing the first guide block, wherein a second plurality of electronic component interposing-and-retaining portions having a shape corresponding to two side surfaces interposing the other opposing corner of the pair of opposing corners of the bottom surface of the electronic components are formed along a longitudinal direction of the second guide block;
    an optical sensor of a transmission type provided on the shuttle plate, the optical sensor including a light emission unit which emits light having an optical axis ranging from one end portion to the other end portion of the shuttle plate along an upper surface of a plurality of electronic components interposed and retained between the first and second electronic component interposing-and-retaining portions along the longitudinal directions of the first and second guide blocks, and further including an optical sensor which detects the light emitted from the light emission unit at the other end portion of the shuttle plate;
    a sensor slit plate which sets the emitted light so as to pass through a position kept away by a predetermined distance from an upper surface of each of the plurality of electronic components interposed and retained between the first and second electronic component interposingand-retaining portions in accordance with a thickness of the electronic components; and a height position adjustment device which adjusts a height position of the sensor slit plate in accordance with the thickness of the electronic components, wherein the first and second guide blocks retain a plurality of electronic components in an electronic component retention space formed and fixed on the shuttle plate by using a position determination hole determined in advance in accordance with a distance between the pair of opposing corners of the bottom surface of an electronic component to be conveyed.

4. The electronic component conveying apparatus of claim 3, wherein the height position adjustment device comprises a slit height adjustment block fixed on the sensor slit plate, and a slit fixing member for adjusting a height of the sensor slit plate relative to the shuttle plate while the electronic component to be conveyed is placed on the shuttle plate.

* * * * *